(12) United States Patent
Hawawini et al.

(10) Patent No.: US 9,977,091 B2
(45) Date of Patent: May 22, 2018

(54) BATTERY FUEL GAUGES SHARING CURRENT INFORMATION BETWEEN MULTIPLE BATTERY CHARGERS

(71) Applicant: QUALCOMM Incorporated, San Diego, CA (US)

(72) Inventors: Shadi Hawawini, Mountain View, CA (US); Christian Sporck, Campbell, CA (US); Paolo Baruzzi, Fremont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 138 days.

(21) Appl. No.: 14/698,834

(22) Filed: Apr. 28, 2015

(65) Prior Publication Data

US 2016/0320456 A1 Nov. 3, 2016

(51) Int. Cl.
*G01N 27/416* (2006.01)
*G01R 31/36* (2006.01)
*H02J 7/00* (2006.01)

(52) U.S. Cl.
CPC ..... *G01R 31/3648* (2013.01); *G01R 31/3624* (2013.01); *G01R 31/3634* (2013.01); *H02J 7/0021* (2013.01); *H02J 7/0052* (2013.01); *H02J 2007/005* (2013.01); *H02J 2007/0049* (2013.01); *H02J 2007/0096* (2013.01)

(58) Field of Classification Search
CPC .................................................. G01R 31/3624
USPC ........................................................ 324/426
See application file for complete search history.

(56) References Cited

U.S. PATENT DOCUMENTS

| 4,728,807 A * | 3/1988 | Harafuji .................... G05F 1/59 307/48 |
|---|---|---|
| 2004/0189251 A1 | 9/2004 | Kutkut et al. |
| 2012/0153899 A1 | 6/2012 | Marschalkowski et al. |
| 2012/0262122 A1 | 10/2012 | Sato et al. |
| 2013/0082662 A1 | 4/2013 | Carre et al. |
| 2014/0029147 A1 | 1/2014 | Kadirvel, III et al. |
| 2014/0132204 A1* | 5/2014 | Hong ................. G01R 31/3606 320/107 |
| 2014/0191568 A1 | 7/2014 | Partovi |
| 2014/0253023 A1 | 9/2014 | Paryani et al. |
| 2014/0347003 A1* | 11/2014 | Sporck .................. H02J 7/0052 320/107 |

FOREIGN PATENT DOCUMENTS

WO 2014173037 A1 10/2014

OTHER PUBLICATIONS

International Search Report—PCT/US2016/026940—ISA/EPO—dated Jun. 27, 2016.
Written Opinion—PCT/US2016/026940—ISA/EPO—dated Jun. 27, 2016.

* cited by examiner

*Primary Examiner* — Edward Tso
*Assistant Examiner* — Ahmed Omar
(74) *Attorney, Agent, or Firm* — Haynes and Boone, LLP

(57) ABSTRACT

In one embodiment, a fuel gauge system is described that comprises two or more battery chargers on different integrated circuits (ICs) coupled in parallel to a battery for charging the battery. Each battery charger IC generates a current signal indicative of current generated by said each battery charger IC into the same battery. A fuel gauge is responsible for accurately reporting the battery state of charge, based on a combination of voltage, current, and temperature information.

20 Claims, 5 Drawing Sheets

500

Receiving, from each of two or more battery chargers on different integrated circuits (ICs) coupled in parallel to a battery for charging the battery, a current signal indicative of current generated by each said battery charger IC
502

Determining total battery current in response to the current signals from the battery chargers
504

BATTERY FUEL GAUGES SHARING CURRENT INFORMATION BETWEEN MULTIPLE BATTERY CHARGERS

BACKGROUND

The disclosure relates to battery fuel gauges, and in particular, to battery fuel gauges sharing current information between multiple battery chargers.

Unless otherwise indicated herein, the approaches described in this section are not admitted to be prior art by inclusion in this section.

Applications use a multi-path battery charging implementation that splits charge current between two or more different battery charger integrated circuits (ICs) to reduce power consumption and thermal losses. One problem with this implementation is accurately measuring total charge and discharge current for the fuel gauge due to the multiple paths.

SUMMARY

The present disclosure includes techniques pertaining to battery fuel gauges sharing current information between multiple battery chargers. In one embodiment, a fuel gauge system is described that comprises two or more battery chargers on different integrated circuits (ICs) coupled in parallel to a battery for charging the battery. Each battery charger IC generates a current signal indicative of current generated by said each battery charger IC into the same battery. A fuel gauge determines total charging current in response to the current signals from the battery chargers and current discharged by the battery.

In one embodiment, the sensed battery current is reported as a voltage signal and the fuel gauge sums the analog voltage signals to determine the total charging current.

In one embodiment, the sensed battery current is reported as a current signal, and the fuel gauge sums the analog current reading to determine the total battery current.

In one embodiment, the current signals are digital signals generated on each battery charger IC, and the fuel gauge sums the digital signals to determine the total charging current.

In one embodiment, the current signals are digital signals generated on each battery charger IC, and each battery charger IC includes a driver to communicate the digital signals to the fuel gauge In one embodiment, the fuel gauge is on one of the battery charger ICs. The other battery charger ICs communicate the digital signals to said one of the battery charger ICs via a bus.

In one embodiment, one battery charger IC combines the battery charging current from the other battery chargers ICs from an input of a current sense circuit on the one battery charger IC to determine the total charging current on the one IC.

In one embodiment, one of the battery chargers is part of a power management integrated circuits (PMIC) IC and the fuel gauge is part of the PMIC.

In one embodiment, the fuel-gauge is on an integrated circuit that is separate from the battery chargers and receives the current signals from the battery chargers.

In yet another embodiment, a fuel gauge system is disclosed that comprises means for coupling two or more battery chargers on different integrated circuits (ICs) in parallel to a battery for charging the battery, each battery charger IC generating a current signal indicative of current generated by said each battery charger IC into the same battery; and means for determining total charging current in response to the current signals from the battery chargers.

In one embodiment, the current signals are analog voltage signals. The means for determining total charging current includes means for summing the analog voltage signals to determine the total charging current.

In one embodiment, the current signals are digital signals generated on each IC. The means for determining total charging current includes means for summing the digital signals to determine the total charging current.

In one embodiment, the means for determining total charging current is on one of the battery charger ICs. The fuel gauge system further comprising means for communicating digital signals from the other battery charger ICs to said one of the battery charger ICs.

In one embodiment, the means for determining total charging current comprises means for combining in one battery charger IC the battery charging current from the other battery chargers ICs from an input of a current sense circuit on the one battery charger IC to determine the total charging current on the one IC.

In one embodiment, one of the battery chargers is part of a power management integrated circuits (PMIC) IC and the means for determining total charging current is part of the PMIC.

In one embodiment, the fuel gauge system further comprises means for generating, in each of said two or more battery chargers, the current signal indicative of current generated by each said battery charger IC.

In still another embodiment, a method is disclosed that comprises receiving, from each of two or more battery chargers on different integrated circuits (ICs) coupled in parallel to a battery for charging the battery, a current signal indicative of current generated by each said battery charger IC into the same battery; and determining total charging current in response to the current signals from the battery chargers.

In one embodiment, the current signals are analog voltage signals. Determining total charging current includes summing the analog voltage signals to determine the total charging current.

In one embodiment, the current signals are digital signals generated on each IC. Determining total charging current includes summing the digital signals to determine the total charging current.

In one embodiment, determining total charging current comprises combining in one battery charger IC the battery charging current from the other battery chargers ICs from an input of a current sense circuit on the one battery charger IC to determine the total charging current on the one IC.

In one embodiment, one of the battery chargers is part of a power management integrated circuits (PMIC) IC. The means for determining total charging current is part of the PMIC.

In one embodiment, the method further comprises coupling in parallel said two or more battery chargers on different integrated circuits to the battery for charging the battery.

In one embodiment, the method further comprises generating, in each of said two or more battery chargers, the current signal indicative of current generated by each said battery charger IC.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Various fuel gauge systems are described for determining total battery current of battery charging systems that comprise two or more battery chargers coupled in parallel to a battery for charging the battery. Each battery charger generates a current signal indicative of current generated by the battery charger (i.e., current signal into or out of a battery from each charger). A fuel gauge determines total battery current in response to the reported battery current from each of the battery chargers. The fuel gauge is typically part of a power management integrated circuit (PMIC). The battery chargers may be on separate ICs. The ICs may include the PMIC, comprising a first battery charger and a fuel gauge on one IC and a battery charger on a second IC, for example.

In one embodiment, current is sensed in each battery charger IC and converted to an analog voltage representing the current. The fuel gauge combines the analog voltages to determine total charging current to the battery.

In one embodiment, current is sensed in each battery charger IC and reported as a proportional current. The fuel gauge combines the currents to determine the total charging current to the battery.

Figure 1:
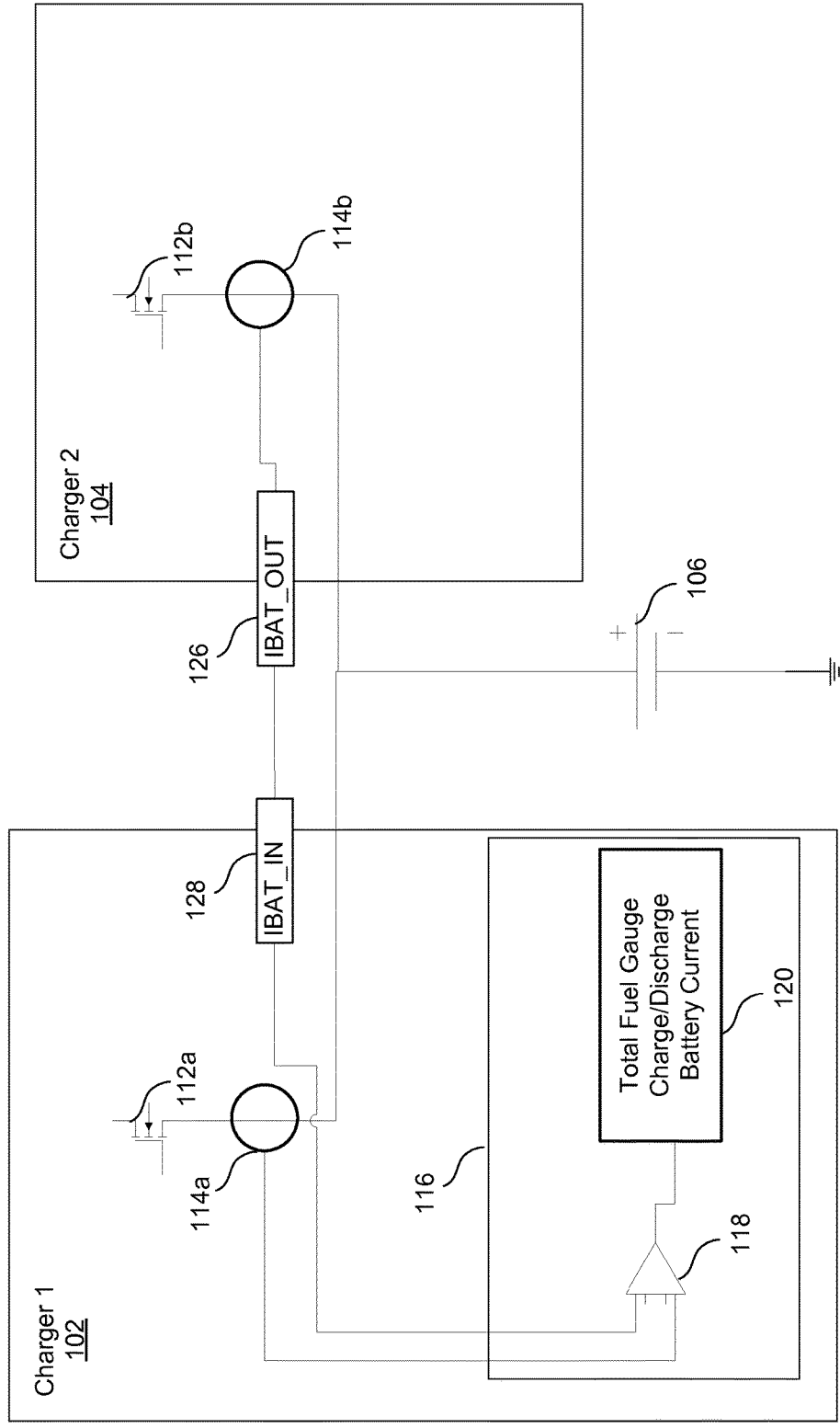
FIG. 1 is a block diagram illustrating a first example of a fuel gauge system according to some embodiments.

FIG. 1 is a block diagram illustrating a fuel gauge system 100 according to some embodiments.

Fuel gauge system 100 comprises a battery charger 102 and a battery charger 104. In some embodiments, battery chargers 102 and 104 are implemented in separate integrated circuits (ICs). In some embodiments, fuel gauge system 100 may be implemented with more than one battery charger 104. Battery charger 102 and battery charger 104 are coupled in parallel to charge a battery 106. The battery 106 may be coupled to another system (not shown), such as a mobile phone or a tablet.

Charger 102 and charger 104 each comprise a battery charger transistors 112a-b (referred to below as "battery charger FET") that provides charging current from each charger to battery 106. Battery charger FETs 112a-b have drains coupled to charger circuitry (not shown) that may include a buck converter, a buck-boost converter, or a low drop-out regulator (LDO). Charger 102 and charger 104 each comprise a current sensor 114a-b that senses the charging current from each charger and provides the sensed charging current, as a voltage or a current, to a fuel gauge circuit 116. In some embodiments, current sensors 114a-b are replica FETs, for example.

One battery charger IC (charger 104 in this example) sends the charge/discharge current information to another charger IC (charger 102 in this example) that has a fuel gauge (fuel gauge 116 in this example). In each charger 102 and 104, the current from the charger battery FET 112 is sensed by current sensor 114. The sensed current from charger 104 (or chargers 104 if implemented) is provided through an output terminal 126 (IBAT_OUT) as an analog voltage through an input terminal 128 (IBAT_IN) of charger 102 to the fuel gauge 116 in charger 102. Fuel gauge 116 includes a summing circuit 118 that adds the sensed currents from battery charger 102 and battery charger 104 together to determine a total charging current to battery 106. A fuel gauge circuit 120 determines the total fuel gauge charging or discharging current provided to battery 106.

In one embodiment, current is provided by both battery chargers to the input of the fuel gauge, which combines the currents to determine total charging current to the battery.

Figure 2:
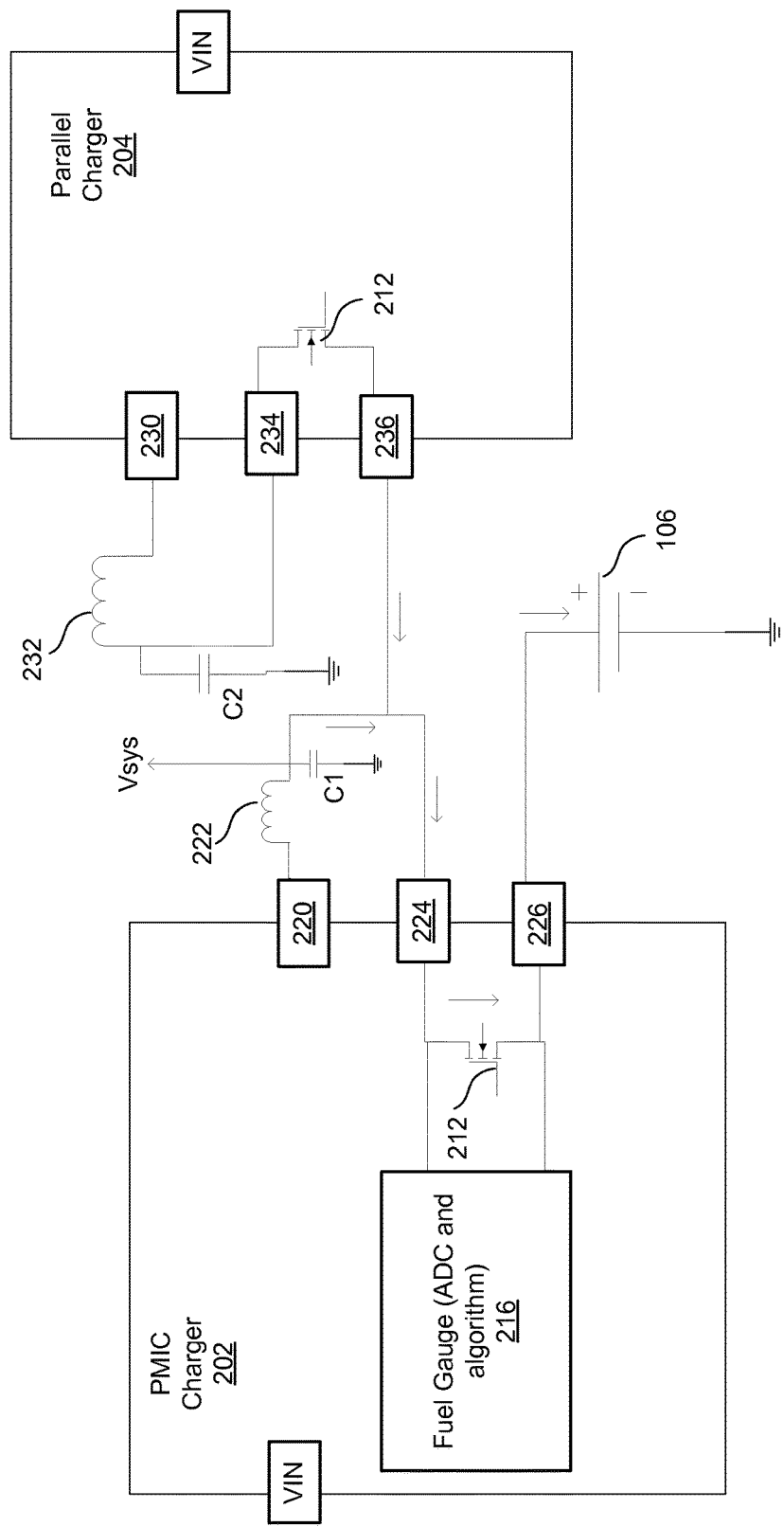
FIG. 2 is a block diagram illustrating a second example of a fuel gauge system according to some embodiments.

FIG. 2 is a block diagram illustrating a fuel gauge system 200 according to some embodiments. Fuel gauge system 200 comprises a battery charger 202 and a battery charger 204. In some embodiments, each battery charger 202 and 204 is implemented in a separate integrated circuit (IC). In various embodiments, battery charger 202 may be implemented on a power management integrated circuit (PMIC), for example. In some embodiments, fuel gauge system 200 may be implemented with more than one battery charger 204. Battery charger 202 and battery charger 204 are coupled in parallel to charge a battery 106. Fuel gauge system 200 includes a fuel gauge 216 that receives currents from multiple battery chargers (charger 202 and charger 204 in this example), sums the currents together upstream from the fuel gauge input, and applies the summed currents to its analog-to-digital converter (ADC) and its fuel gauge algorithm. In this case, the current from the charger battery FET 212 of charger 204 (the parallel charger) is provided as an analog current to the charger battery FET 212 of charger 202. The fuel gauge 116 in charger 202 senses the current through the charger battery FET 212 of charger 202 as the total charging current.

PMIC charger 202 provides charging current through a terminal 220, an inductor 222 (which is coupled to a capacitor C1), a terminal 224, and through the charger battery FET 212, as described above. Inductor 222 and capacitor C1 may be part of a charging circuit, such as a buck converter or buck-boost converter. (The fuel gauge systems of FIGS. 1 and 3 may include a similar inductor and capacitor for each charger.) The PMIC charger 202 provides the charging current through a terminal 226 to the battery 106.

Parallel charger 204 provides charging current through a terminal 230, an inductor 232 (which is coupled to a capacitor C2), a terminal 234, and through the charger battery FET 212, as described above. Inductor 232 and capacitor C2 may be part of a charging circuit, such as a buck converter or buck-boost converter. The parallel inductor 204 provides the charging current through a terminal 236 to the terminal 224 of the PMIC charger 202, where the charging current is summed with charging current from the PMIC charger 202. The sum of the currents is coupled through charger battery FET 212 of PMIC charger 202 and a terminal 226 to the battery 106.

Discharging current is in the opposite direction from the battery 106 to terminal 226, to terminal 224, and to Vsys (the system power supply voltage), for example.

In one embodiment, current is sensed in each battery charger and converted to a digital signal representing the current. The fuel gauge combines the digital signals to determine total charging current to the battery.

Figure 3:
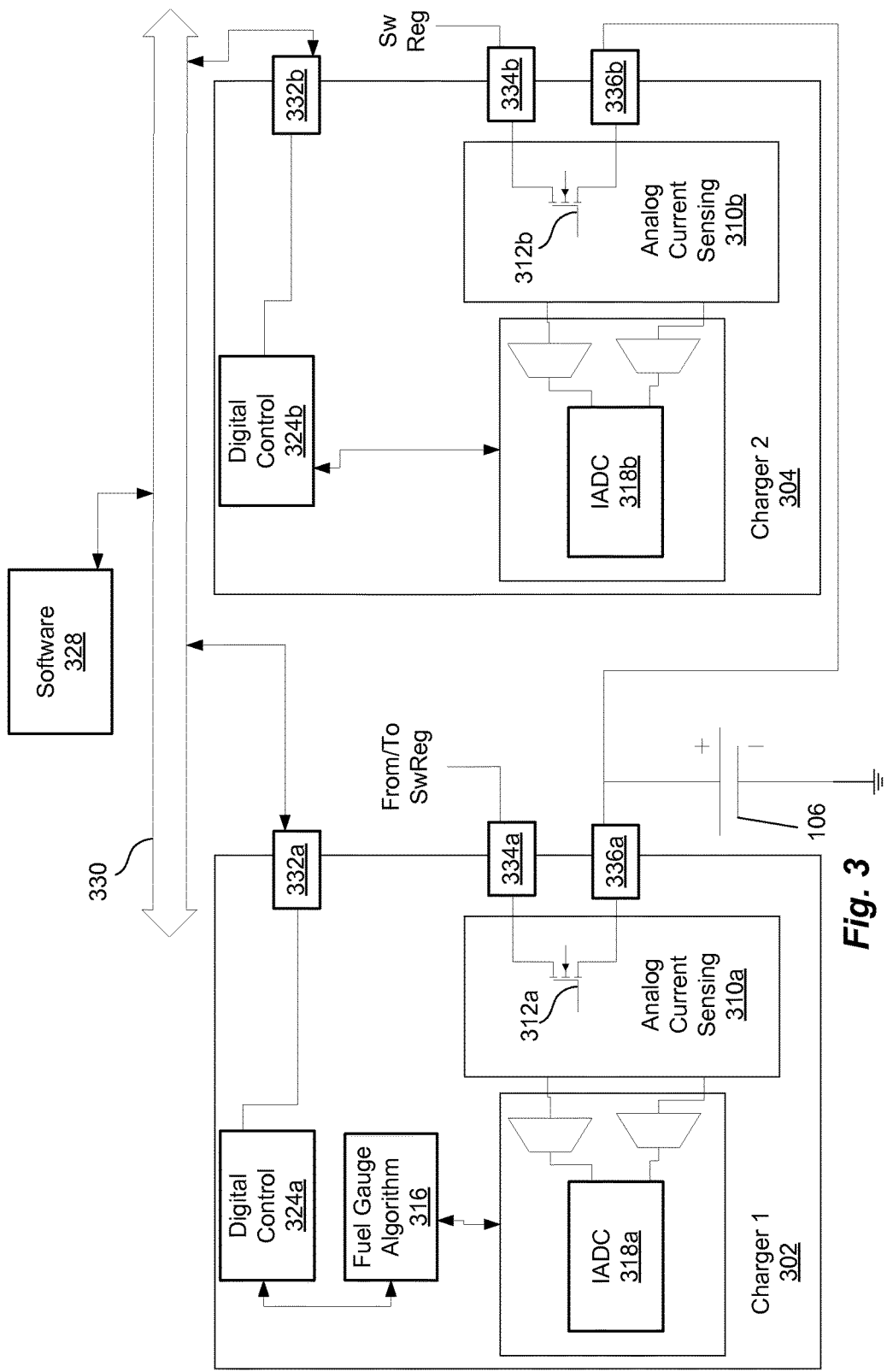
FIG. 3 is a block diagram illustrating a third example of a fuel gauge system according to some embodiments.

FIG. 3 is a block diagram illustrating a fuel gauge system 300 according to some embodiments. Fuel gauge system 300 comprises a battery charger 302 and a battery charger 304. In some embodiments, each battery charger 302 and 304 is implemented in a separate integrated circuit (IC). In various embodiments, battery charger 302 is a PMIC charger. In some embodiments, fuel gauge system 300 may be implemented with more than one battery charger 304. Battery charger 302 and battery charger 304 are coupled in parallel to charge a battery 106.

Fuel gauge system 300 receives currents, as digital signals, from multiple battery chargers (charger 302 and charger 304 in this example), digitally sums the currents together, and applies a fuel gauge algorithm 316 to determine the total charging current to the battery 106.

Each charger 302 and 304 uses analog sensing (in analog current sensing circuits 310a-b, including replica FETs) of the current from each charger (e.g., the current through charger battery FETs 312a-b via terminals 334a-b and 336a-b, respectively) to generate a local analog signal, which is digitized by an analog-to-digital converters (ADC) 318a-b (shown as current ADC, IADC) on each charger IC to generate a digitized charging current for the charger. Digital control blocks 324a-b on each charger may be used to communicate digitized charging current of charger 304 from charger 304 IC to charger 302 IC via a terminals 332a-b over a data bus 330. The digitized currents may then be combined on charger 302 IC and used in the fuel gauge algorithm 316, for example. Software 328 executed in a processor and stored in a memory may control the chargers 302 and 304 over the data bus 330. In some embodiments, software 328 may implement a protocol that configures IADCs 318a-b and the trigger and reporting of the conversion. In some embodiments, IADCs 318a-b communicates directly to the bus 330. In some embodiments, a single master bus configuration can be used.

Figure 4:
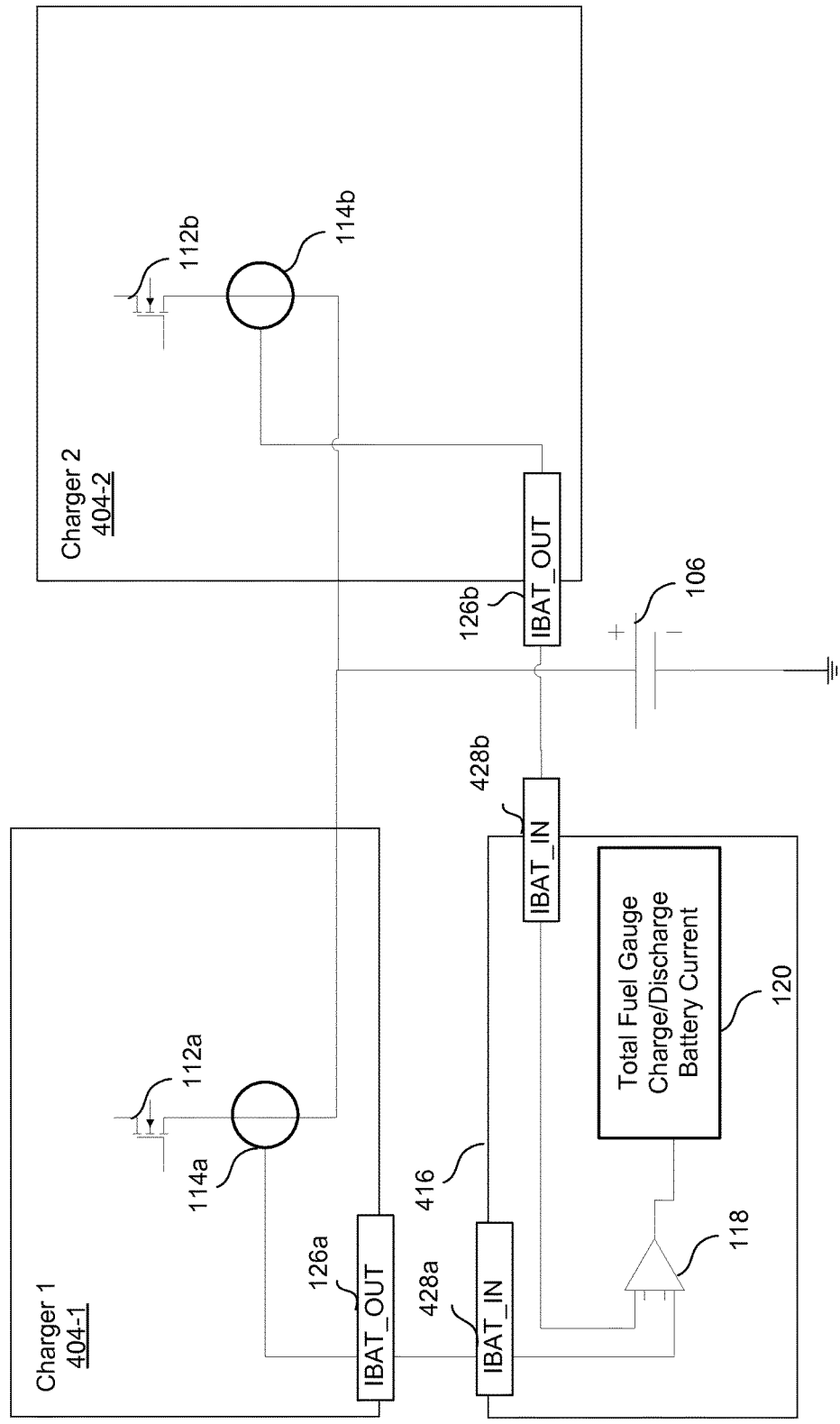
FIG. 4 is a block diagram illustrating a fourth example of a fuel gauge system according to some embodiments.

FIG. 4 is a block diagram illustrating a fuel gauge system 100 according to some embodiments.

Fuel gauge system 400 comprises a plurality of battery chargers 404-1 and 404-2. In some embodiments, battery chargers 404-1 and 404-2 are implemented in separate integrated circuits (ICs). Battery chargers 404 are coupled in parallel to charge a battery 106. The battery 106 may be coupled to another system (not shown), such as a mobile phone or a tablet. Chargers 404-1 and 404-2 comprise battery charger transistors 112a-b and current sensor 114a-b, respectively, arranged in a similar manner as in charger 104 (FIG. 1).

Each of battery chargers 404-1 and 404-2 send the charge/discharge current information to a fuel gauge 416. Fuel gauge 416 is similar to fuel gauge 116 (FIG. 1), but is in an IC that is separate from ICs of the battery chargers 404-1 and 404-2. In each charger, the current from the charger battery FETs 112a-b that is sensed by current sensors 114a-b are provided through output terminal 126a-b (IBAT_OUT) as an analog voltage through input terminals 428a-b (IBAT_IN) of fuel gauge 416. Fuel gauge algorithm circuit 120 determines the total fuel gauge charging or discharging current provided to battery 106.

In one embodiment, current is provided by both battery chargers to the input of the fuel gauge, which combines the currents to determine total charging current to the battery.

Figure 5:
FIG. 5 is a process flow diagram illustrating a process flow of a fuel gauge system according to some embodiments.

FIG. 5 is a process flow diagram illustrating a process flow 500 of a fuel gauge system according to some embodiments.

For two or more battery chargers on different integrated circuits (ICs) coupled in parallel to a battery for charging the battery, at 502, a current signal indicative of current generated by each said battery charger IC into the same battery is received. At 504, total battery current is determined in response to the current signals from the battery chargers.

For some fuel gauge systems, such as fuel gauge system 100, the current signals are analog voltage signals. At 504, determining total battery current includes summing the analog voltage signals to determine the total charging current.

For some fuel gauge systems, such as fuel gauge system 300, the current signals are digital signals generated on each IC. At 504, determining total charging current includes summing the digital signals to determine the total charging current.

For some fuel gauge systems, such as fuel gauge system 300, at 504, determining total charging current comprises combining in one battery charger IC the battery charging current from the other battery chargers ICs from an input of a current sense circuit on the one battery charger IC to determine the total charging current on the one IC.

The fuel gauge systems described herein avoids the additional series resistance with the battery from a sense resistor that is coupled in series between the battery and all chargers for sensing the total charging and discharging current.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A fuel gauge system comprising:
    two or more battery chargers, each of the two or more battery charges being on different integrated circuits (ICs), each of the two or more battery charges being coupled in parallel to a battery for charging the battery, each of the two or more battery chargers generating a current signal indicative of current generated by said each of the two or more battery chargers into the battery; and
    a fuel gauge located within one of the two or more battery chargers, the fuel gauge being coupled to receive the current signal from each of the two or more battery chargers and configured to determine total battery current in response to each of the current signals and current discharged by the battery.

2. The fuel gauge system of claim 1 wherein the current signals are analog voltage signals, and the fuel gauge sums the analog voltage signals to determine the total charging current.

3. The fuel gauge system of claim 1 wherein the current signals are analog current signals, and the fuel gauge sums the analog current signals to determine the total charging current.

4. The fuel gauge system of claim 1 wherein the current signals are digital signals generated by each of the two or more battery chargers, and the fuel gauge sums the digital signals to determine the total charging current.

5. The fuel gauge system of claim 4 wherein the fuel gauge is on one of the battery charger ICs, and the other battery charger ICs communicate the digital signals to said one of the battery charger ICs via a bus.

6. The fuel gauge system of claim 1 wherein the fuel-gauge is on an integrated circuit that is separate from the two or more battery chargers and receives the current signals from the two or more battery chargers.

7. The fuel gauge system of claim 1 wherein one battery charger IC combines the battery charging current from the other battery chargers ICs from an input of a current sense circuit on the one battery charger IC to determine the total charging current on the one IC.

8. The fuel gauge system of claim 1 wherein one of the battery chargers is part of a power management integrated circuits (PMIC) IC and the fuel gauge is part of the PMIC.

9. A fuel gauge system comprising:
means for coupling two or more battery chargers on different integrated circuits (ICs) in parallel to a battery for charging the battery, each of the battery chargers generating a current signal indicative of current generated by said each battery charger into the battery; and
means provided in one of the integrated circuits for receiving the current signal from each of the two or more battery chargers and for determining total charging current in response to the current signals from each of the battery chargers and current discharged from the battery.

10. The fuel gauge system of claim 9 wherein the current signals are analog voltage signals, and wherein the means for determining total charging current includes means for summing the analog voltage signals to determine the total charging current.

11. The fuel gauge system of claim 9 wherein the current signals are digital signals generated on each IC, and wherein the means for determining total charging current includes means for summing the digital signals to determine the total charging current.

12. The fuel gauge system of claim 11 wherein the means for determining total charging current is on one of the battery charger ICs, and, the fuel gauge system further comprising means for communicating digital signals from the other battery charger ICs to said one of the battery charger ICs.

13. The fuel gauge system of claim 9 wherein the means for determining total charging current comprises means for combining in one battery charger IC the battery charging current from the other battery chargers ICs from an input of a current sense circuit on the one battery charger IC to determine the total charging current on the one IC.

14. A method comprising:
receiving, from each of two or more battery chargers on different integrated circuits (ICs) coupled in parallel to a battery for charging the battery, a current signal indicative of current generated by each said battery charger IC into the same battery, the current signal from each of the two or more battery charges being received into one of the two or more battery chargers; and
determining total charging current in response to the current signals from each of the battery chargers and current discharged from the battery.

15. The method of claim 14 wherein the current signals are analog voltage signals, and wherein determining total charging current includes summing the analog voltage signals to determine the total charging current.

16. The method of claim 14 wherein the current signals are digital signals generated on each IC, and wherein determining total charging current includes summing the digital signals to determine the total charging current.

17. The method of claim 14 wherein determining total charging current comprises combining in one battery charger IC the battery charging current from the other battery chargers ICs from an input of a current sense circuit on the one battery charger IC to determine the total charging current on the one IC.

18. The method of claim 14 wherein one of the battery chargers is part of a power management integrated circuits (PMIC) IC and the means for determining total charging current is part of the PMIC.

19. The method of claim 14 further comprising coupling in parallel said two or more battery chargers on different integrated circuits to the battery for charging the battery.

20. The method of claim 14 further comprising generating, in each of said two or more battery chargers, the current signal indicative of current generated by each said battery charger IC.

* * * * *